United States Patent
Ishizaka

[11] Patent Number: 5,838,183
[45] Date of Patent: Nov. 17, 1998

[54] CLOCK SIGNAL GENERATOR HAVING VOLTAGE LEVEL CONVERTING CIRCUIT

[75] Inventor: Yasuhiro Ishizaka, Gunma, Japan

[73] Assignee: NEC Corporation, Japan

[21] Appl. No.: 789,658

[22] Filed: Jan. 27, 1997

[30] Foreign Application Priority Data

Jan. 29, 1996 [JP] Japan ................................. 8-012644

[51] Int. Cl.$^6$ ........................................................ H03L 7/06
[52] U.S. Cl. ............................ 327/299; 327/150; 327/159
[58] Field of Search ..................................... 327/147, 150, 327/151, 156, 159, 160, 291, 299, 298

[56] References Cited

U.S. PATENT DOCUMENTS

5,663,668  9/1997  Hayashi et al. ......................... 327/156
5,668,504  9/1997  Rodriques Ramalho ............... 327/147

Primary Examiner—Timothy P. Callahan
Assistant Examiner—T. T. Lam
Attorney, Agent, or Firm—Ostrolenk, Faber, Gerb & Soffen, LLP

[57] ABSTRACT

A clock signal generator comprises a phase locked loop circuit and a voltage level converting circuit. The phase locked loop circuit is supplied with a control base clock signal and an input clock signal which has a first frequency. The phase locked loop circuit converts the input clock signal to generate a PLL output clock signal which has the second frequency. The input clock signal has one of binary values that has a voltage level which is similar to a reference voltage level of a reference voltage. The voltage level converting circuit is supplied with the PLL output clock signal, the control base clock signal, the reference voltage, and a voltage level control signal. The voltage level converting circuit converts, in response to the control base clock signal, the reference voltage, and the voltage level control signal, the PLL output clock signal to generate an output clock signal which has an output voltage level which is different from the reference voltage level.

6 Claims, 9 Drawing Sheets

| LV3 | LV2 | LV1 | Vi (VOLT) |
|---|---|---|---|
| 0 | 0 | 0 | 0.0 |
| 0 | 0 | 1 | 1.0 |
| 0 | 1 | 0 | 2.0 |
| 0 | 1 | 1 | 3.0 |
| 1 | 0 | 0 | 4.0 |
| 1 | 0 | 1 | 5.0 |
| 1 | 1 | 0 | 6.0 |
| 1 | 1 | 1 | 7.0 |

FIG. 9

| VD3 | VD2 | VD1 | VDT (VOLT) |
|---|---|---|---|
| 0 | 0 | 0 | 0.0 |
| 0 | 0 | 1 | 1.0 |
| 0 | 1 | 0 | 2.0 |
| 0 | 1 | 1 | 3.0 |
| 1 | 0 | 0 | 4.0 |
| 1 | 0 | 1 | 5.0 |
| 1 | 1 | 0 | 6.0 |
| 1 | 1 | 1 | 7.0 |

FIG. 10

| LG4 | LG3 | LG2 | LG1 | DIFFERENCE (VOLT) |
|---|---|---|---|---|
| 0 | 0 | 0 | 1 | 1.0 |
| 0 | 0 | 1 | 0 | 2.0 |
| 0 | 1 | 0 | 0 | 3.0 |
| 1 | 0 | 0 | 0 | 4.0 |

FIG. 13

CLOCK SIGNAL GENERATOR HAVING VOLTAGE LEVEL CONVERTING CIRCUIT

BACKGROUND OF THE INVENTION

This invention relates to a clock signal generator, and more particularly, to a clock signal generator which is capable of converting a voltage level of an output clock signal.

DESCRIPTION OF THE RELATED ART

In the manner which will be described more in detail, the first conventional clock signal generator comprises a phase locked loop (PLL) circuit and a tri-states buffer. The clock signal generator is supplied with a reference voltage. The PLL circuit is supplied with an input clock signal which has an optional frequency. The PLL circuit converts the input clock signal to generate a PLL output clock signal which has a specific frequency.

In case that the first conventional clock signal generator needs an output clock signal which has an optional voltage level which is different from a reference level of the reference voltage, an outside voltage decreasing device is connected to the first conventional clock signal generator. The outside voltage decreasing device is supplied with the reference voltage and the PLL output clock signal. The outside voltage decreasing device decreases the PLL output clock signal to generate the output clock signal. This is because the first conventional clock signal generator can output the only PLL output clock signal which has a voltage that is similar to the reference voltage.

In the manner which will be described more in detail, the second conventional clock signal generator comprises the PLL circuit and first through n-th tri-states buffers, where n represents an integer greater than two. In case that the second conventional clock signal generator needs first through n-th output clock signals which have optional voltage levels which are different from the reference level of the reference voltage, first through n-th outside voltage decreasing devices are connected to the second conventional clock signal generator. The outside voltage decreasing devices are supplied with the reference voltage and the PLL output clock signals. The outside voltage decreasing devices decrease the PLL output clock signals to generate the output clock signals. This is because the second clock signal generator can output the only PLL output clock signals each of which has the voltage that is similar to the reference voltage.

However, since the first conventional clock signal generator needs the outside voltage decreasing device and the second conventional clock signal generator needs the first through n-th outside voltage decreasing devices, a data processing unit having the first or second conventional clock signal generator has a great area, a great weight, and a high cost.

SUMMARY OF THE INVENTION

It is therefore an object of this invention to provide a clock signal generator which is capable of converting a voltage of an output clock signal.

It is another object of this invention to provide a clock signal generator which has a small area, a small weight, and a low cost.

Other objects of this invention will become clear as the description proceeds.

According to this invention, there is provided a clock signal generator which comprises:

a phase locked loop circuit supplied with a control base clock signal and an input clock signal which has a first frequency for converting the input clock signal to generate a PLL output clock signal which has a second frequency, the input clock signal having one of binary values that has a voltage level which is similar to a reference voltage level of a reference voltage; and a voltage level converting circuit supplied with the PLL output clock signal, the control base clock signal, the reference voltage, and a voltage level control signal for converting, in response to the control base clock signal, the reference voltage, and the voltage level control signal, the PLL output clock signal to generate an output clock signal which has an output voltage level which is different from the reference voltage level.

DESCRIPTION OF THE PREFERRED EMBODIMENTS

Figure 1:
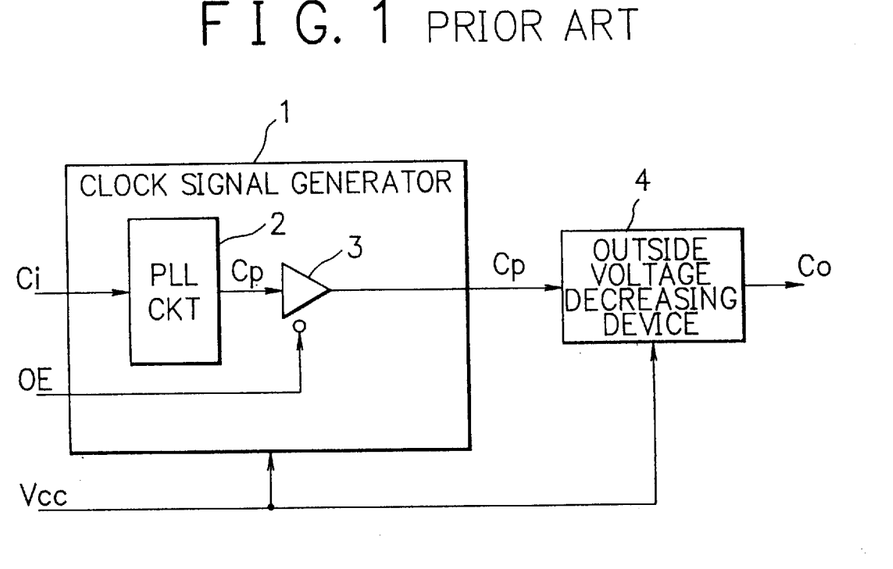
FIG. 1 is a block diagram of the first conventional clock signal generator.
Figure 2:
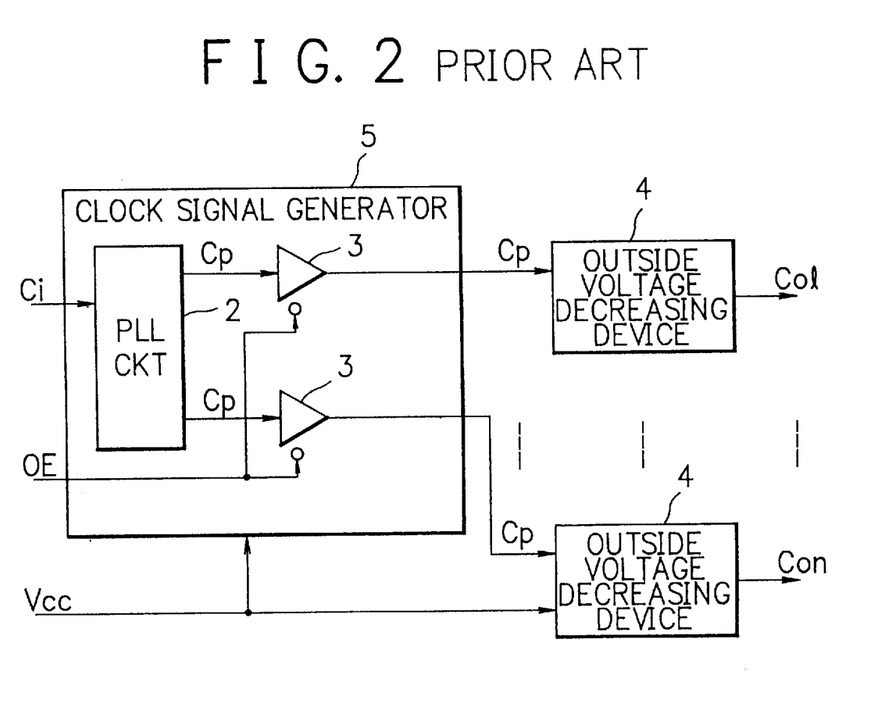
FIG. 2 is a block diagram of the second conventional clock signal generator.

Referring to FIGS. 1 and 2, first and second conventional clock signal generators will first be described for a better understanding of this invention.

In FIG. 1, the first conventional clock signal generator 1 comprises a phase locked loop (PLL) circuit 2 and a tri-states buffer 3 which is connected to the PLL circuit 2.

The clock signal generator 1 is supplied with a reference voltage Vcc. The PLL circuit 2 is supplied with an input clock signal Ci which has an optional frequency. The PLL circuit 2 converts the input clock signal Ci to generate a PLL output clock signal Cp which has a specific frequency. The tri-states buffer 3 is supplied with an output control signal OE which has "1" and "0" levels. When the output control signal OE is effective, namely, when the output control signal OE has the "0" level, the tri-states buffer 3 passes and outputs the PLL output clock signal Cp from the PLL circuit 2.

The input clock signal Ci and the PLL output clock signal Cp have binary values. One of the binary values of the input clock signal Ci and the PLL output clock signal Cp is similar to the reference voltage Vcc (such as TTL level) which is supplied to the clock signal generator 1.

In case that the clock signal generator 1 needs an output clock signal Co which has an optional voltage level which is different from a reference level of the reference voltage Vcc, an outside voltage decreasing device 4 is connected to the clock signal generator 1. The outside voltage decreasing device 4 is supplied with the reference voltage Vcc and the PLL output clock signal Cp. The outside voltage decreasing device 4 decreases the PLL output clock signal Cp to generate the output clock signal Co. This is because the clock signal generator 1 can output the only PLL output clock signal Cp which has a voltage that is similar to the reference voltage Vcc.

In FIG. 2, the second conventional clock signal generator 5 comprises the PLL circuit 2 and first through n-th tri-states buffers 3 which are connected to the PLL circuit 2, where n represents an integer greater than two. In case that the clock signal generator 5 needs first through n-th output clock signals Co1 to Con which have optional voltage levels which are different from the reference level of the reference voltage Vcc, first through n-th outside voltage decreasing devices 4 are connected to the clock signal generator 5. The outside voltage decreasing devices 4 are supplied with the reference voltage Vcc and the PLL output clock signal Cp. The outside voltage decreasing devices 4 decrease the PLL output clock signals Cp to generate the output clock signals Co1 to Con. This is because the clock signal generator 5 can output the only PLL output clock signals Cp each of which has the voltage that is similar to the reference voltage Vcc.

However, since the first conventional clock signal generator 1 needs the outside voltage decreasing device 4 and the second conventional clock signal generator 5 needs the first through n-th outside voltage decreasing devices 4, a data processing unit having the conventional clock signal generator 1 or 5 has a great area, a great weight, and a high cost.

Figure 3:
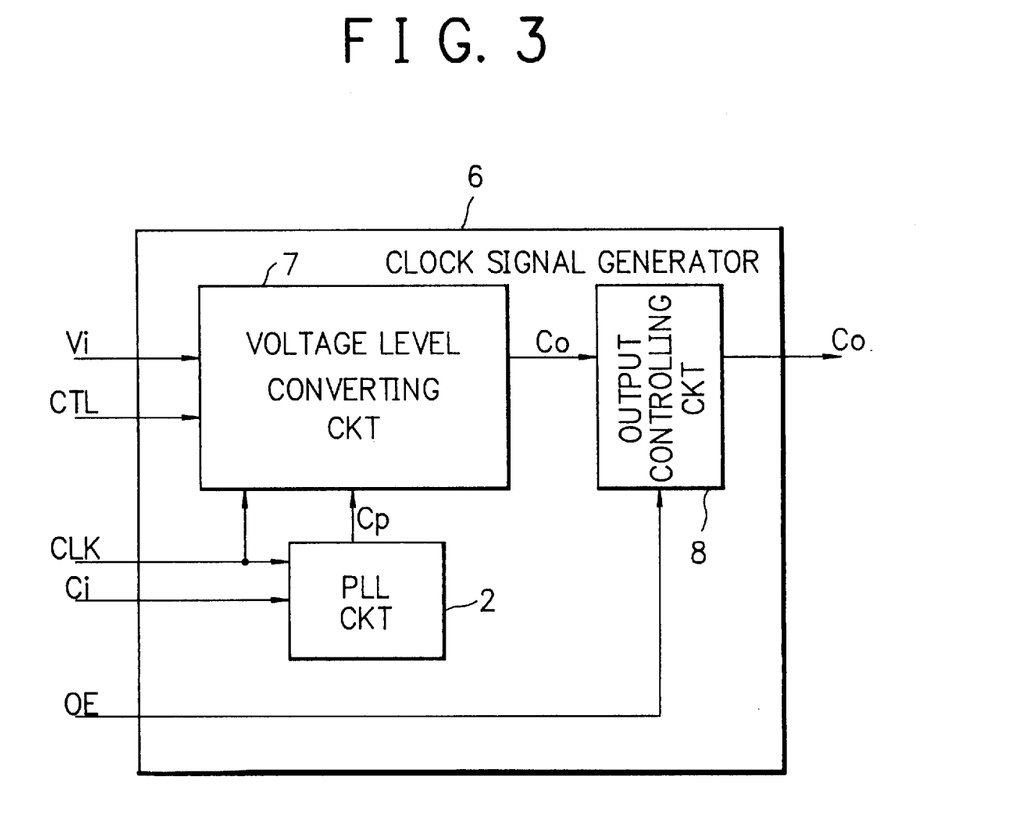
FIG. 3 is a block diagram of a clock signal generator according to the first embodiment of this invention.

Referring to FIG. 3, the description will be proceed to a clock signal generator according to the first embodiment of this invention. Similar parts are designated by like reference numerals.

A clock signal generator 6 comprises the PLL circuit 2, a voltage level converting circuit 7, and an output controlling circuit 8. The PLL circuit 2 is supplied with a control base clock signal CLK and the input clock signal Ci which has the first or the optional frequency. The PLL circuit 2 converts the input clock signal Ci to generate the PLL output clock signal Cp which has the second or the specific frequency. The input clock signal has one of binary values that has a voltage level which is similar to a reference voltage level of a reference voltage Vi.

The voltage level converting circuit 7 is connected to the PLL circuit 2. The voltage level converting circuit 7 is supplied with the PLL output clock signal Cp, the control base clock signal CLK, the reference voltage Vi, and a voltage level control signal CTL. The voltage level converting circuit 7 converts, in response to the control base clock signal CLK, the reference voltage Vi, and the voltage level control signal CTL, the PLL output clock signal Cp to generate an output clock signal Co which has an output voltage level which is different from the reference voltage level of the reference voltage Vi.

The output controlling circuit 8 is connected to the voltage level converting circuit 7. The output controlling circuit 8 is supplied with the output control signal OE and the output clock signal Co from the voltage level converting circuit 7. The output control signal OE has "1" level and "0" levels. When the output control signal OE is effective, namely, when the output control signal OE has the "1" level, the output controlling circuit 8 outputs the output clock signal Co.

Referring FIGS. 4, 5, 6, 8, 9, and 10, the description will be-proceed to a clock signal generator according to a second embodiment of this invention. Similar parts are designated by like reference numerals.

Figure 4:
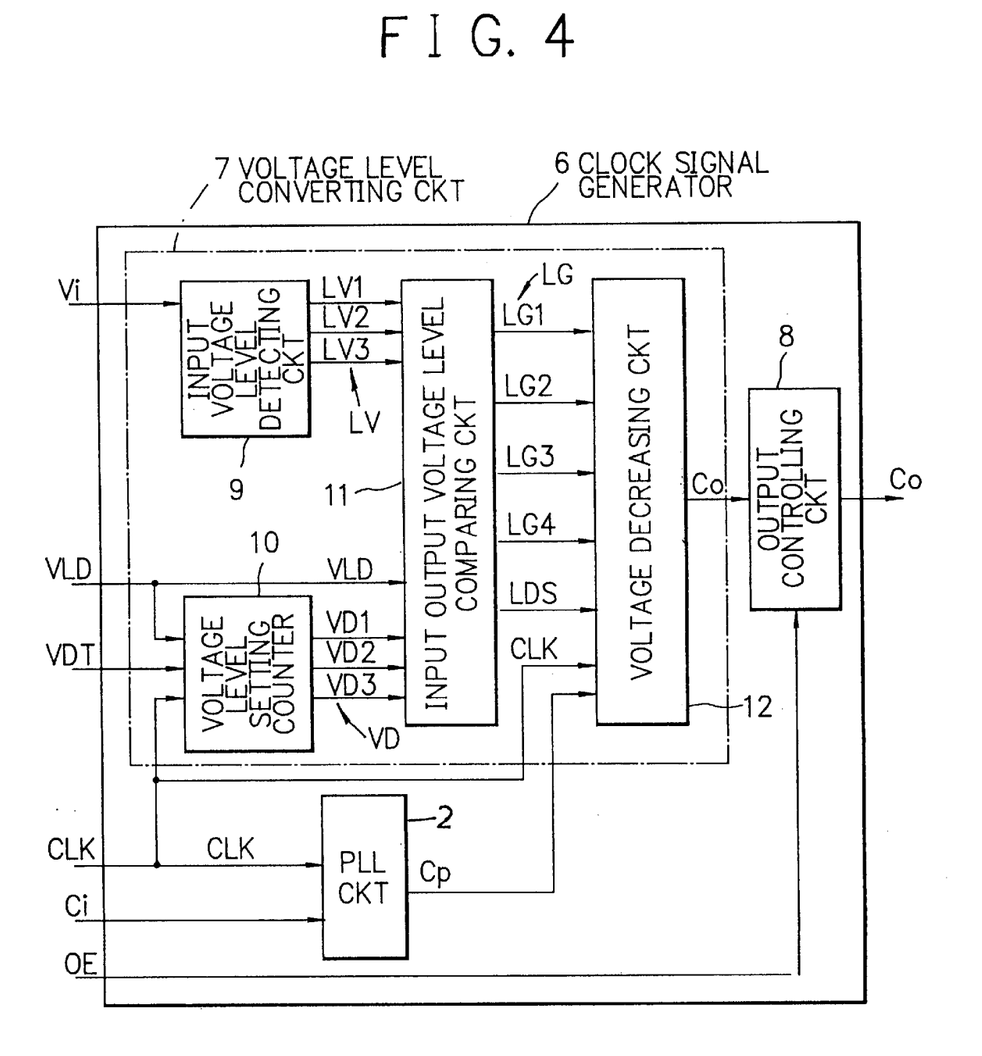
FIG. 4 is a block diagram of a clock signal generator according to the second embodiment of this invention.

In FIG. 4, the clock signal generator 6 includes the phase PLL circuit 2, the voltage level converting circuit 7, and the output controlling circuit 8. The voltage level converting circuit 7 comprises an input voltage level detecting circuit 9, a voltage level setting counter 10, an input output voltage level comparing circuit 11, and a voltage decreasing circuit 12.

The input voltage level, detecting circuit 9 is supplied with the reference voltage Vi. The input voltage level detecting circuit 9 detects the reference voltage Vi to generate a converted reference signal LV. The input voltage level detecting circuit 9 has first through third voltage level detecting output terminals which are connected to the input output voltage level comparing circuit 11. The converted reference signal LV comprises first through third converted reference signals LV1, LV2, and LV3. The first through third converted reference signals LV1 to LV3 are supplied to the input output voltage level comparing circuit 11 through the first through fourth voltage level detecting output terminals.

The voltage level setting counter 10 is supplied with the control base clock signal CLK and the voltage level control signal CTL. The voltage level control signal CTL comprises a voltage level setting serial datum VDT and a datum effective command signal VLD. The voltage level setting counter 10 generates, in response to the control base clock signal CLK, the voltage level setting serial datum VDT, and the data effective command signal VLD, a counted voltage level setting signal VD. The counted voltage level setting signal VD comprises first through third counted voltage level setting signals VD1, VD2, and VD3. The voltage level setting counter 10 has first through third voltage level setting output terminals which are connected to the input output voltage level comparing circuit 11. The first through third counted voltage level setting signals VD1 to VD3 are supplied to the input output voltage level comparing circuit 11 through the first through third counted voltage level setting output terminals.

The input output voltage level comparing circuit 11 is connected to the input voltage level detecting circuit 9 through the first through fourth voltage level detecting output terminals. The input output voltage level comparing circuit 11 is connected to the, voltage level setting counter 10 through the first through third voltage level setting output terminals. The input output voltage level comparing circuit 11 is supplied with the datum effective command signal VLD, the first through third converted reference signals LV1 to LV3, and the first through third counted voltage level setting signals VD1 to VD3. The input output voltage level comparing circuit 11 compares the first through third converted reference signals LV1 to LV3 with the first through third counted voltage level setting signals VD1 to VD3 to generate a voltage compared result signal LG. The voltage compared result signal LG comprises first through fourth voltage compared result signals LG1, LG2, LG3, and LG4. The input output voltage level comparing circuit 11 has first through fourth level compared result output terminals which are connected to the voltage decreasing circuit 12. The first through fourth voltage compared result signals LG1 to LG4 are supplied to the voltage decreasing circuit 12 through the first through fourth level compared result output terminals. Also, the input output voltage level comparing circuit 11 generates and supplies a voltage decrease starting signal LDS to the voltage decreasing circuit 12.

The voltage decreasing circuit 12 is connected to the PLL circuit 2. The voltage decreasing circuit 12 is connected to the input output voltage level comparing circuit 11 through the first through fourth level compared result output terminals. The voltage decreasing circuit 12 is supplied with the control base clock signal CLK, the PLL output clock signal Cp, the voltage decrease starting signal LDS, and the first through fourth voltage compared result signals LG1 to LG4. The voltage decreasing circuit 12 decreases, in response to the control base clock signal CLK, the voltage decrease starting signal LDS, and the first through fourth voltage compared result signals LG1 to LG4, the PLL output clock signal Cp to generate the output clock signal Co.

The output controlling circuit 8 is connected to the voltage decreasing circuit 12. When the output control signal OE is effective, namely, when the output control signal OE has the "1" level, the output controlling circuit 8 outputs the output clock signal Co.

Figure 5:
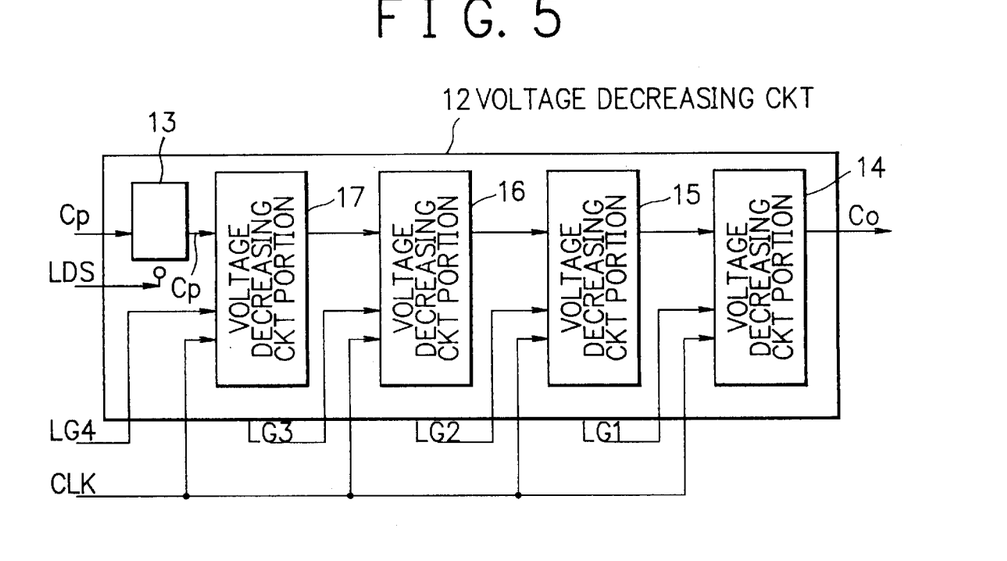
FIG. 5 is a block diagram of a voltage decreasing circuit of the clock signal generator illustrated in FIG. 4.

In FIG. 5, the voltage decreasing circuit 12 comprises a first switching circuit 13 and first through fourth voltage decreasing circuit portions 14, 15, 16, and 17. The first switching circuit 13 is connected to the PLL circuit 2, the input output voltage comparing circuit 11, and the fourth voltage decreasing circuit portion 17. The first switching circuit 13 is supplied with the PLL output clock signal Cp and the voltage decrease starting signal LDS. The first switching circuit 13 makes us of negative logic. When the voltage decrease starting signal LDS is effective, namely, when the voltage decrease starting signal LDS has a "0" level, the first switching circuit 13 passes the PLL output clock signal Cp.

The fourth voltage decreasing circuit portion 17 is connected to the first switching circuit 13. The first through fourth voltage decreasing circuit portions 14 to 17 are, in serial order, connected and are supplied with the PLL output clock signal Cp from the first switching circuit 13. The first through fourth voltage decreasing circuit portions 14 to 17 are supplied with the control base clock signal CLK.

The first through fourth voltage decreasing circuit portions 14 to 17 have first through fourth constants R1, R2, R3, and R4, respectively. The first through fourth voltage decreasing circuit portions 14 to 17 are connected to the input output voltage level comparing circuit 11 through the first through fourth voltage level detecting output terminals, respectively. The first through fourth voltage decreasing circuit portions 14 to 17 are supplied with the first through fourth voltage compared result signals LG1 to LG4, respectively.

Figure 6:
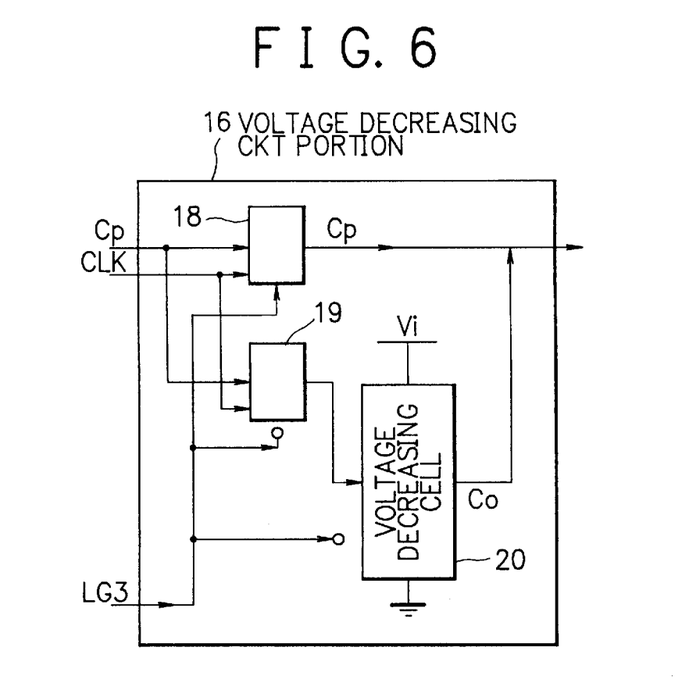
FIG. 6 is a block diagram of one of voltage decreasing circuit portions of the voltage decreasing circuit illustrated in FIG. 5.

In FIG. 6, the third voltage decreasing circuit portion 16 comprises second and third switching circuits 18 and 19 and the third voltage decreasing cell 20. The second switching circuit 18 makes use of positive logic. The third switching circuit 19 makes use of negative logic. The second and third switching circuits 18 and 19 are supplied with the control base clock signal CLK, the PLL output clock signal Cp, and the voltage compared result signals LG3. The second and third switching circuits 18 and 19 operate in synchronization with the control base clock signal CLK. When the voltage compared result signals LG3 is not effective, namely, the voltage compared result signals LG3 has a "0" level, the second switching circuits 18 passes the PLL output clock signal Cp. When the voltage compared result signals LG3 is effective, namely, the voltage compared result signals LG3 has a "1" level, the third switching circuits 19 passes the PLL output clock signal Cp. The voltage decreasing cell 20 is connected to the third switching circuits 19. The third voltage decreasing cell 20 has the third constant R3. The third voltage decreasing cell 20 is supplied with the reference voltage Vi, the voltage compared result signals LG3, and the PLL output clock signal Cp from the third switching circuit 19. The third voltage decreasing cell 20 decreases the PLL output clock signal Cp to generate the output clock signal Co.

Similarly, the first voltage decreasing circuit portion 14 comprises the second and third switching circuits 18 and 19 and the first voltage decreasing cell (not shown) which has the first constant R1. The second voltage decreasing circuit portion 15 comprises the second and third switching circuits 18 and 19 and the second voltage decreasing cell (not shown) which has the constant R2. The fourth voltage decreasing circuit portion 17 comprises the second and third switching circuits 18 and 19 and the fourth voltage decreasing cell (not shown) which has the fourth constant R4.

Figure 7:
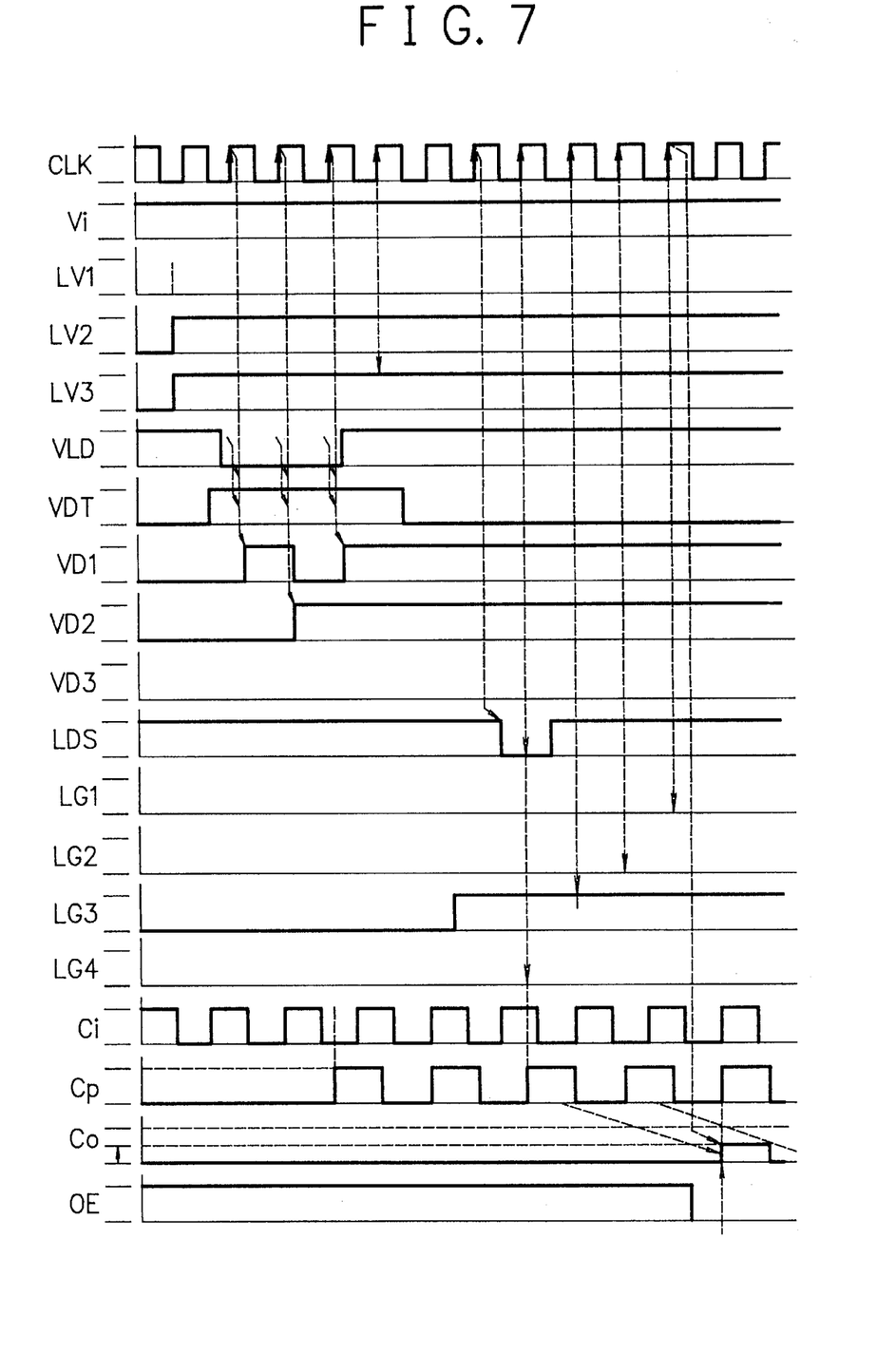
FIG. 7 is a schematic waveform diagram for use in describing operation of the clock signal generator illustrated in FIG. 4.
Figure 8:
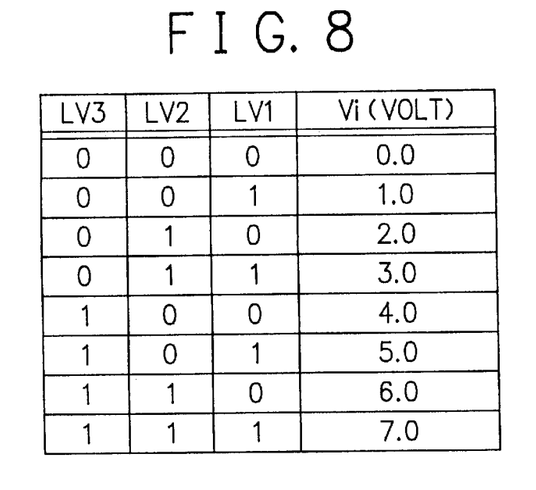
FIGS. 8, 9, and 10 are truth tables for use in describing operation of the clock signal generator illustrated in FIG. 4.
Figure 9:
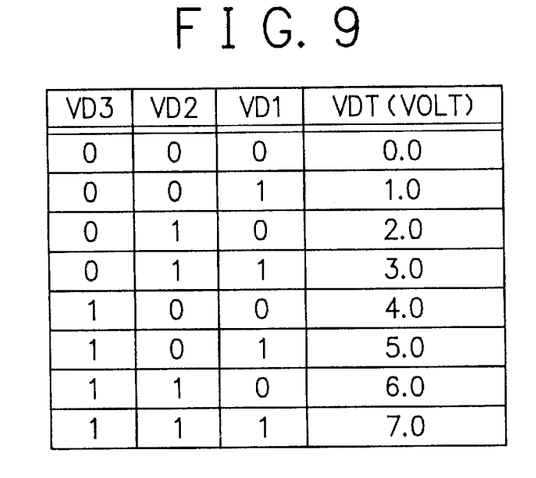

Referring to FIGS. 7 to 10 together with FIGS. 4 to 6, the operation of the clock signal generator 6 will be described in detail. It is assumed that the reference voltage Vi is equal to 6.0 V and a setting voltage of the output clock signal Co is equal to 3.0 V. As shown in FIG. 8, LV1, LV2, and LV3 have "1" level and "0" levels. Since the reference voltage Vi is equal to 6.0 V, as shown in FIG. 8, LV1 is equal to the "0" level, LV2 is equal to the "1" level, and LV3 is equal to the "1" level. It is determined by the voltage level setting serial signal VDT to set a voltage of the output clock signal Co.

When the datum effective command signal VLD is effective, namely, when the datum effective command signal VLD has a "0" level as shown in FIG. 7, the voltage level setting counter 10 counts the voltage level setting serial signal VDT in onsets of the control base clock signal CLK. When the datum effective command signal VLD becomes not effective, namely, when the datum effective command signal VLD becomes to have a "1" level, the voltage level setting counter 10 does not count the voltage level setting serial signal VDT, namely, the voltage level setting counter 10 stops an operation. At the same time, the voltage level setting counter 10 generates and supplies the first through third counted voltage level setting signals VD1, VD2, and VD3 to the input output voltage level comparing circuit 11. Since the setting voltage of the output clock signal Co is equal to 3.0 V, the voltage level setting counter 10 holds three "1" levels or "high" levels of three clocks of the control base clock signal CLK as shown in FIG. 7. Since, VDT is equal to 3.0 V in FIG. 9, VD1 is equal to a "1" level, VD2 is equal to a "1" level, and VD3 is equal to a "0" level.

At the same time, the PLL circuit 2 converts the input clock signal Ci to generate the PLL output clock signal Cp. Each of voltages of the input clock signal Ci and the PLL output clock signal Cp is equal to 6.0 which is similar to the reference voltage Vi.

Figure 10:
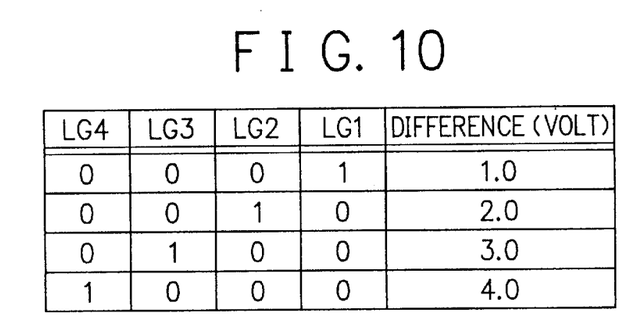

The input output voltage level comparing circuit 11 compares, in an onset of the control base clock signal CLK, the first through third converted reference signals LV1 to LV3 with the first through third counted voltage level setting signals VD1 to VD3 to generate the voltage compared result signal LG. The voltage compared result signal LG represents a difference between the reference voltage Vi and the setting voltage of the output clock signal Co. The voltage compared result signal LG comprises the first through fourth voltage compared result signals LG1 to LG4. Since the reference voltage Vi is equal to 6.0 V and the setting voltage of the output clock signal Co is equal to 3.0 V, the difference between the reference voltage Vi and the setting voltage of the output clock signal Co is equal to 3.0 V. Therefore, as shown in FIG. 10, LG1 is equal to a "0" level, LG2 is equal to a "0" level, LG3 is equal to a "1" level, and LG4 is equal to a "0" level. Also, when the comparing operation of the input output voltage level comparing circuit 11 ends, the input output voltage level comparing circuit 11 generates and supplies the voltage decrease starting signal LSD to the voltage decreasing circuit 12.

When the voltage decreasing circuit 12 appreciates in an onset of the control base clock signal CLK, that the voltage decrease starting signal LSD is effective, namely that the voltage decrease starting signal LSD has a "0" level in FIG. 7, the voltage decreasing circuit 12 operates the first through fourth voltage decreasing circuit portions 14 to 17 (FIG. 5). Since the difference between the reference voltage Vi and the setting voltage of the output clock signal Co is equal to 3.0 V, the only LG3 becomes effective as shown in FIG. 10. As a result, the only third voltage decreasing circuit portions 16 decreases the PLL output clock signal Cp. In the third voltage decreasing circuit portions 16 (FIG. 6), the third switching circuit 19 becomes effective.

Therefore, the PLL output clock signal Cp passes through the third switching circuit 19 and is supplied to the third voltage decreasing cell 20. The third voltage decreasing cell 20 decreases the PLL output clock signal Cp to generate the output clock signal Co. As a result, the output clock signal Co becomes to have a voltage of 3.0 V.

Figure 11:
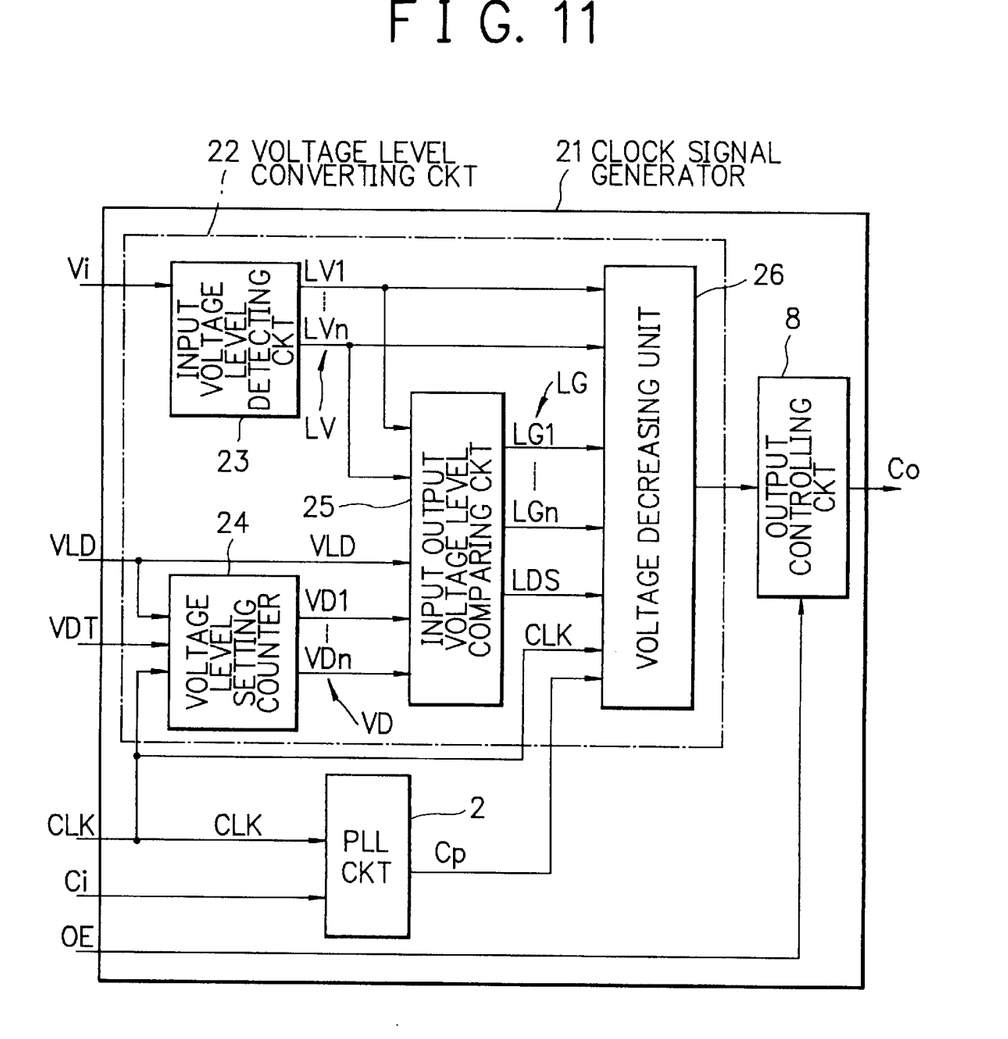
FIG. 11 is a block diagram of a clock signal generator according to the third embodiment of this invention.
Figure 12:
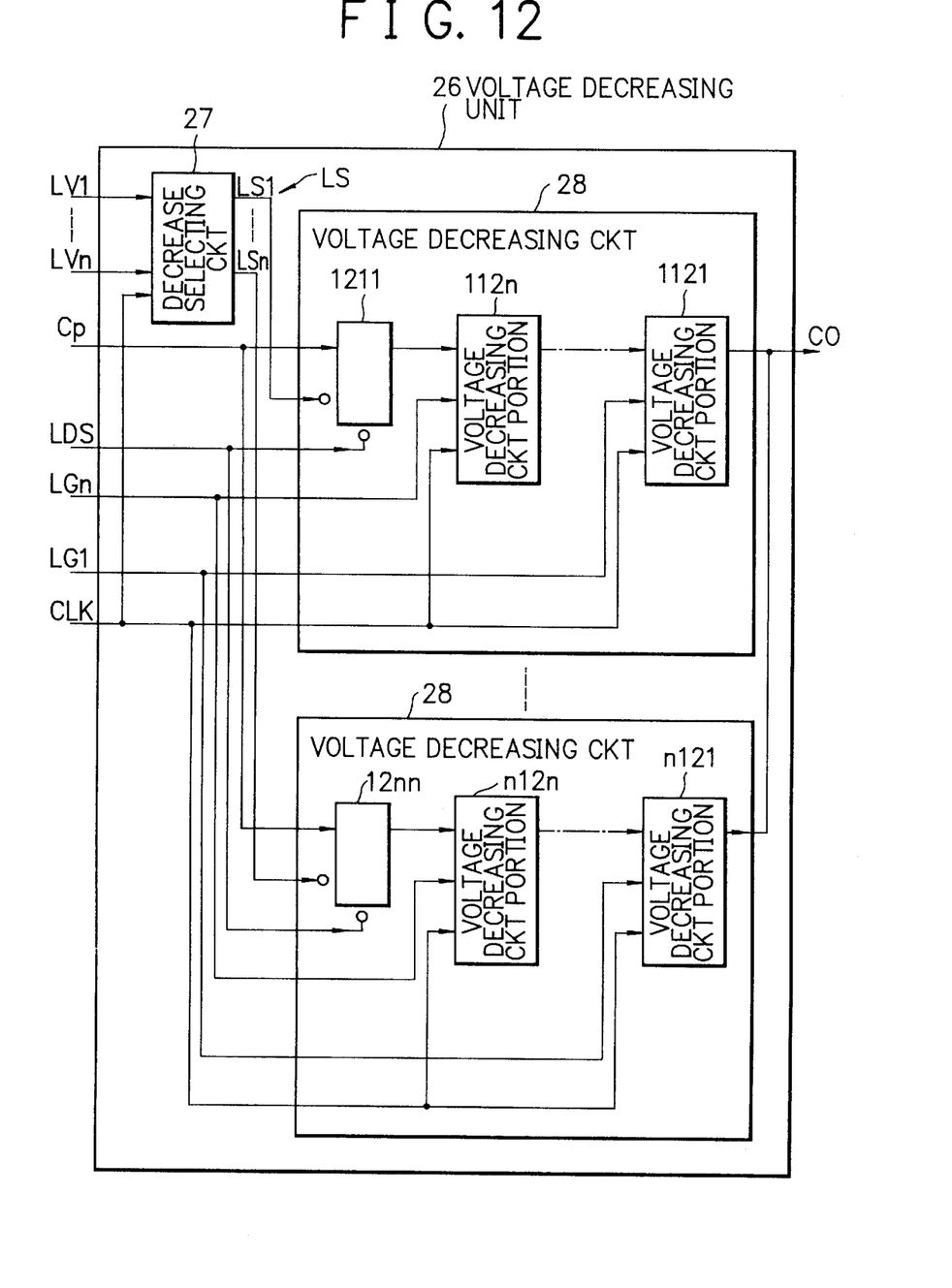
FIG. 12 is a block diagram of a voltage decreasing unit of the clock signal generator illustrated in FIG. 11.

Referring to FIGS. 11 and 12, the description will be proceed to a clock signal generator according to a third embodiment of this invention. Similar parts are designated by like reference numerals.

In FIG. 11, the clock signal generator 21 comprises the PLL circuit 2, a voltage level converting circuit 22, and the output controlling circuit 8. The voltage level converting circuit 22 comprises an input voltage level detecting circuit 23, a voltage level setting counter 24, an input output voltage level comparing circuit 25, and a voltage decreasing unit 26.

The input voltage level detecting circuit 23 is supplied with the reference voltage Vi. The input voltage level detecting circuit 23 detects the input reference voltage Vi to generate the converted reference signal LV. The input voltage level detecting circuit 23 has first through n-th voltage level output terminals which are connected to the input output voltage level comparing circuit 25 and the voltage decreasing unit 26. The converted reference signal LV comprises first through n-th converted reference signals LV1 to LVn, where n represents an integer greater than two. The first through n-th converted reference signals LV1 to LVn are supplied to the input output voltage level comparing circuit 25 and the voltage decreasing unit 26 through the first through n-th voltage level output terminals.

The voltage level setting counter 24 is supplied with the control base clock signal, the voltage level setting serial datum CTL, and the datum effective command signal VLD.

The voltage level setting counter 24 generates the counted voltage level setting signal VD in response to the control base clock signal, the voltage level setting serial datum CTL, and the datum effective command signal VLD. The voltage level setting counter 24 has first through n-th voltage level setting output terminals which are connected to the input output voltage level comparing circuit 25. The counted voltage level setting signal VD comprises first through n-th counted voltage level setting signals VD1 to VDn. The first through n-th counted voltage level setting signals VD1 to VDn are supplied to the input output voltage level comparing circuit 25 through the first through n-th voltage level setting output terminals.

The input output voltage level comparing circuit 25 is connected to the input voltage level detecting circuit 23 and the voltage level setting counter 24. The input output voltage level comparing circuit 25 compares the converted reference signal LV with the counted voltage level setting signal VD to generate the voltage compared result signal LG. The input output voltage level comparing circuit 25 has first through n-th level compared result output terminals which are connected to the voltage decreasing unit 26. The voltage compared result signal LG comprises first through n-th voltage compared result signals LG1 to LGn. The first through n-th voltage compared result signals LG1 to LGn are supplied to the voltage decreasing unit 26 through the first through n-th level compared result output terminals.

The voltage decreasing unit 26 is connected to the PLL circuit 2, the input voltage level detecting circuit 23, and the input output voltage level comparing circuit 25. The voltage decreasing unit 26 decreases, in response to the converted reference signal LV and the voltage compared result signal LD, the PLL output clock signal Cp to generate the output clock signal Co.

In FIG. 12, the voltage decreasing unit 26 comprises a decrease selecting circuit 27 and first through n-th voltage decreasing circuits 28. The decrease selecting circuit 27 is connected to the first through n-th voltage level output terminals of the input voltage level detecting circuit 23 and the first through n-th voltage decreasing circuits 28. The decrease selecting circuit 27 generates, in response to the first through n-th converted reference signals LV1 to LVn, first through n-th decrease selection signals LS1 to LSn. The first voltage decreasing circuit 28 comprises first through n-th voltage decreasing circuit portions 1121 to 112n which have constants R111 to R11n, respectively. The first through n-th voltage decreasing circuit portions 1121 to 112n decreases, in response to the decrease selection signal S1 and the first through n-th voltage compared result signals LG1 to LGn, the PLL output clock signal Cp to generate the output clock signal Co.

Similarly, the n-th voltage decreasing circuit 28 comprises first through n-th voltage decreasing circuit portions n121 to n12n which have constants R1n1 to R1nn, respectively. The first through n-th voltage decreasing circuit portions n121 to n12n decreases, in response to the decrease selection signal LSn and the first through n-th voltage compared result signals LG1 to LGn, the PLL output clock signal Cp to generate the output clock signal Co. One of the first through n-th voltage decreasing circuits 28 is selected by the decrease selection signals LS1 to LSn. For example, when the first voltage decreasing circuit 281 is selected by the decrease selection signals LS1 to LSn , one of the first through n-th voltage decreasing circuit portions 1121 to 112n is selected by the first through n-th voltage compared result signals LG1 to LGn and decreases the PLL output clock signal Cp to generate the output clock signal Co.

Figure 13:
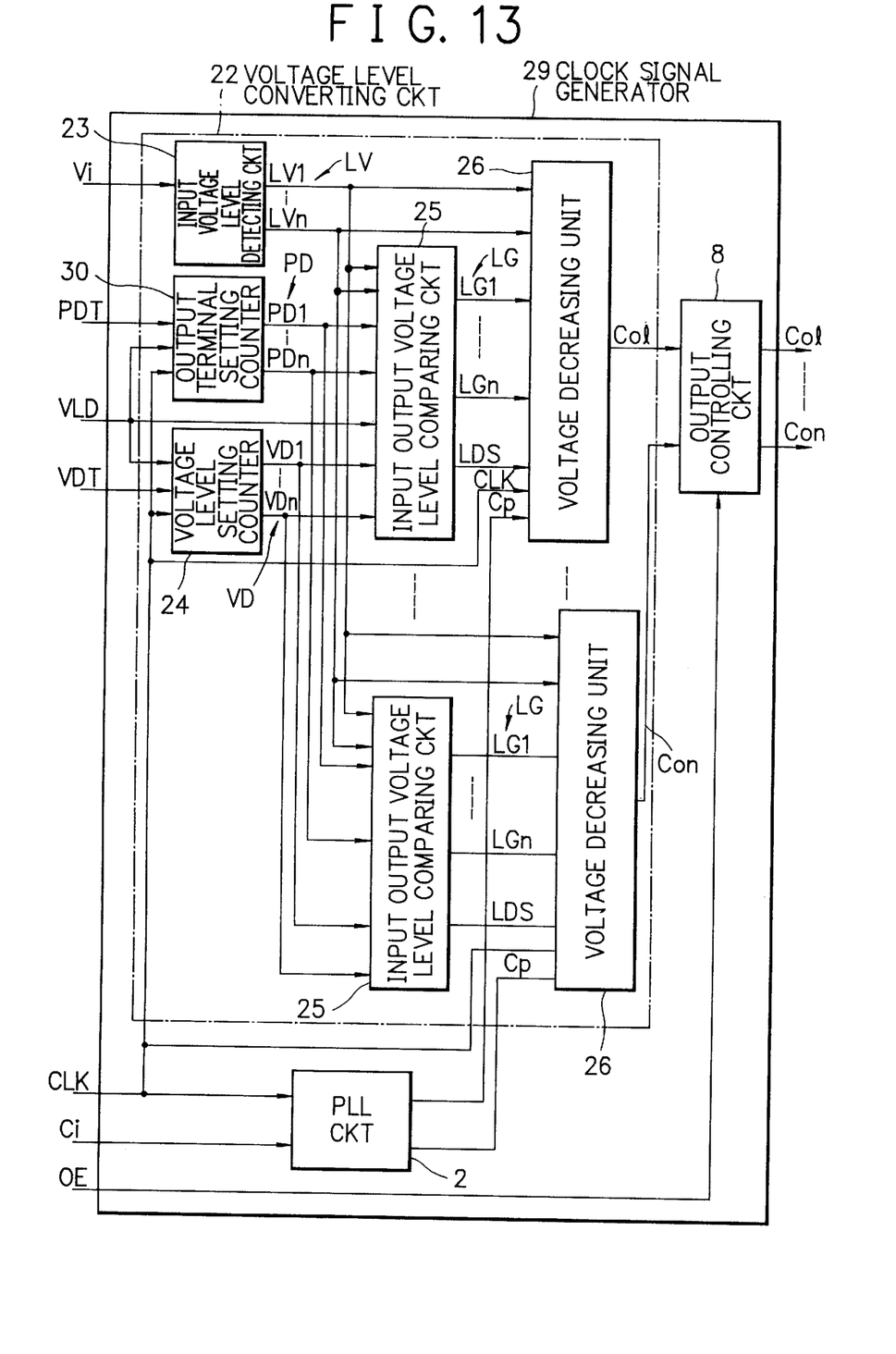
FIG. 13 is a block diagram of a clock signal generator according to the fourth embodiment of this invention.

Referring to FIG. 13, the description will proceed to a clock signal generator according to a fourth embodiment of this invention. Similar parts are designated by like reference numerals.

The clock signal generator 29 comprises the PLL circuit 2, the voltage level converting circuit 22, and the output controlling circuit 8. The voltage level converting circuit 22 comprises the input voltage level detecting circuit 23, the voltage level setting counter 24, first through n-th input output voltage level comparing circuits 25, first through n-th voltage decreasing units 26, and an output terminal setting counter 30.

The output terminal setting counter 30 is supplied with an output terminal setting serial datum PDT as an output terminal setting signal. The output terminal setting counter 30 counts the output terminal setting serial datum PDT to generate a counted output terminal setting signal PD. The counted output terminal setting signal PD comprises first through n-th counted output terminal setting signals PD1 to PDn. The output terminal setting counter 30 has first through n-th terminal setting signal output terminals which are the first through n-th input output voltage level comparing circuits 25. The first through n-th counted output terminal setting signals PD1 to PDn are supplied to the first through n-th input output voltage level comparing circuits 25 through the first through n-th terminal setting signal output terminals. One of the first through n-th input output voltage level comparing circuits 25 is selected by the first through n-th counted output terminal setting signals PD1 to PDn.

Also, the first through n-th input output voltage level comparing circuits 25 are connected to the input voltage level detecting circuit 23 and the voltage level setting counter 24. The first through n-th voltage decreasing units 26 are connected to the first through n-th input output voltage level comparing circuits 25. The first through n-th voltage decreasing units 26 decrease the PLL output clock signal Cp to generate first through n-th output clock signals Co1 to Con, respectively.

The output controlling circuit 8 is connected to the first through n-th voltage decreasing units 26. When the output control signal OE is effective, the output controlling circuit 8 outputs the first through n-th output clock signals Co1 to Con.

Next, will be described the effect of the clock signal generator 6 illustrated in FIG. 4. It is assumed that, in FIG. 2, ten outside voltage decreasing devices 4 are connected to the clock signal generator 5.

First will be described miniaturization of a substrate of the data processing unit. It is assumed that the clock signal generator 5 and the outside voltage decreasing devices 4 are formed by a surface mount type and have twenty-two terminals each of which has a distance of 127 mm between adjacent terminals. An area which is necessary to mount the clock signal generator 5 on substrate of the data processing unit is equal to about 150 square mm. The area includes area of the clock signal generator 5 and clearances between the adjacent devices. Since there are ten same outside voltage decreasing devices 4, the ten outside voltage decreasing devices 4 have an area of about 1,500 square mm. As a result, a total area of the clock signal generator 5 and the ten outside voltage decreasing devices 4 is equal to about 1,650 square mm.

On the other hand, an area of the clock signal generator 6 of FIG. 4 is equal to about 1,450 square mm. Therefore, an area which is decreased is equal to about 200 square mm. A factor of the area which is decreased is equal to about 12 percent.

Next will be described lightening of the substrate of the data processing unit. It is assumed that the clock signal generator 5 and the outside voltage decreasing devices 4 are formed by the surface mount type and have twenty-two terminals each of which has a distance of 127 mm between adjacent terminals. A weight of the clock signal generator 5 is equal to about 2 g. Since there are ten same outside voltage decreasing devices 4, the ten outside voltage decreasing devices 4 have a weight of about 20 g. As a result, a total weight of the clock signal generator 5 and the ten outside voltage decreasing devices 4 is equal to about 22 g.

On the other hand, a weight of the clock signal generator 6 of FIG. 4 is equal to about 20 g. Therefore, a weight which is decreased is equal to about 2 g. A factor of the weight which is decreased is equal to about 9 percent.

Next description will be described increase of a cost of the substrate in the data processing unit. It is assumed that the clock signal generator 5 and the outside voltage decreasing devices 4 are formed by the surface mount type and have twenty-two terminals each of which has a distance of 127 mm between adjacent terminals. A cost of the clock signal generator 5 is equal to about 300 yen. Since a cost of the outside voltage decreasing device 4 is equal to about 300 yen, a cost of the ten outside voltage decreasing devices 4 is equal to about 3,000 yen. As a result, a total cost of the clock signal generator 5 and the ten outside voltage decreasing devices 4 is equal to about 3,300 yen.

On the other-hand, a cost of the clock signal generator 6 of FIG. 4 is equal to about 2,900 yen. As a result, a cost which is decreased is equal to about 400 yen. A factor of the cost which is decreased is equal to about 12 percent. Therefore, in case of manufacturing one hundred thousand data processing units, a cost which is decreased is equal to about forty million yen.

What is claimed is:

1. A clock signal generator comprising:

a phase locked loop circuit supplied with a control base clock signal and an input clock signal which has a first frequency for converting said input clock signal to generate a PLL output clock signal which has a second frequency, said input clock signal having one of binary values that has a voltage level which is similar to a reference voltage level of a reference voltage; and a voltage level converting circuit supplied with said PLL output clock signal, said control base clock signal, said reference voltage, and a voltage level control signal for converting, in response to said control base clock signal, said reference voltage, and said voltage level control signal, said PLL output clock signal to generate an output clock signal which has an output voltage level which is different from said reference voltage levels;

wherein said voltage level converting circuit comprises:

an input voltage level detecting circuit supplied with said reference voltage for detecting said reference voltage to generate a converted reference signal;

a voltage level setting counter supplied with said control base clock signal and said voltage level control signal for generating, in response to said control base clock signal and said voltage level control signal, a counted voltage level setting signal;

an input output voltage level comparing circuit connected to said input voltage level detecting circuit and said voltage level setting counter, said input output voltage level comparing circuit for comparing said converted reference signal with said counted voltage level setting signal to generate a voltage compared result signal; and a voltage decreasing circuit supplied with said control base clock signal and connected to said phase locked loop circuit and said input output voltage level comparing circuit for decreasing said PLL output clock signal, in response to said voltage compared result signal, to generate said output clock signal.

2. A clock signal generator as claimed in claim 1 wherein:

said converted reference signal comprises first through n-th converted reference signals, said counted voltage level setting signal comprising first through n-th counted voltage level setting signals, said voltage compared result signal comprising first through n-th voltage compared result signals, where n represents an integer greater than two;

said input voltage level detecting circuit having first through n-th voltage level detecting output terminals which are connected to said input output voltage level comparing circuit, said first through n-th converted reference signals being supplied to said input output voltage level comparing circuit through said first through n-th voltage level detecting output terminals;

said voltage level setting counter having first through n-th voltage level setting output terminals which are connected to said input output voltage level comparing circuit, said first through n-th counted voltage level setting signals being supplied to said input output voltage level comparing circuit through said first through n-th voltage level setting output terminals;

said input output voltage level comparing circuit having first through n-th level compared result output terminals which are connected to said voltage decreasing circuit, said first through n-th voltage compared result signals being supplied to said voltage decreasing circuit through said first through n-th level compared result output terminals; and said voltage decreasing circuit comprising first through n-th voltage decreasing circuit portions which decrease said PLL output clock signal, in response to said first through n-th voltage compared result signals, to generate said output clock signal.

3. A clock signal generator comprising:

a phase locked loop circuit supplied with a control base clock signal and an input clock signal which has a first frequency for converting said input clock signal to generate a PLL output clock signal which has a second frequency, said input clock signal having one of binary values that has a voltage level which is similar to a reference voltage level of a reference voltage; and a voltage level converting circuit supplied with said PLL output clock signal, said control base clock signal, said reference voltage, and a voltage level control signal for converting, in response to said control base clock signal, said reference voltage, and said voltage level control signal, said PLL output clock signal to generate an output clock signal which has an output voltage level which is different from said reference voltage level;

wherein said voltage level converting circuit comprises:

an input voltage level detecting circuit supplied with said reference voltage for detecting said reference voltage to generate a converted reference signal;

a voltage level setting counter supplied with said control base clock signal and said voltage level control signal for generating, in response to said control base clock signal and said voltage level control signal a counted voltage level setting signal;

an input output voltage level comparing circuit connected to said input voltage level detecting circuit and said voltage level setting counter, said input output voltage level comparing circuit for comparing said converted reference signal with said counted voltage level setting signal to generate a voltage compared result signal; and a voltage decreasing unit supplied with said control base clock signal and connected to said phase locked loop circuit, said input voltage level detecting circuit, and said input output voltage level comparing circuit for decreasing said PPL output clock signal, in response to converted reference signal and said voltage compared result signal, to generate said output clock signal.

4. A clock signal generator as claimed in claim 3, wherein:

said converted reference signal comprises first through n-th converted reference signals, said counted voltage level setting signal comprising first through n-th counted voltage level setting signals, said voltage compared result signal comprising first through n-th voltage compared result signals; where n represents an integer greater than two;

said input voltage level detecting circuit having first through n-th voltage level output terminals which are connected to said input output voltage level comparing circuit, said first through n-th converted reference signals being supplied to said input output voltage level comparing circuit through said first through n-th voltage level output terminals;

said voltage level setting counter having first through n-th voltage level setting output terminals which are connected to said input output voltage level comparing circuit, said first through n-th counted voltage level setting signals being supplied to said input output voltage level comparing circuit through said first through n-th voltage level setting output terminals said input output voltage level comparing circuit having first through n-th level compared result output terminals which are connected to said voltage decreasing unit, said first through n-th voltage compared result signals being supplied to said voltage decreasing unit through said first through n-th level compared result output terminals; and said voltage decreasing unit comprising a decrease selecting circuit and first through n-th voltage decreasing circuits, said decrease selecting circuit being connected to said first through n-th voltage level output terminals and said first through n-th voltage decreasing circuits, said decrease selecting circuit being for generating, in response to said first through n-th converted reference signals, first through n-th decrease selection signals, each of said first through n-th voltage decreasing circuits comprising first through n-th voltage decreasing circuit portions which decrease said PLL output clock signal to generate said output clock signal, in response to a respective one of said decrease selection signals and said first through n-th voltage compared result signals.

5. A clock signal generator, comprising:

a phase locked loop circuit supplied with a control base clock signal and an input clock signal which has a first frequency for converting said in-put clock signal to generate a PLL output clock signal which has a second frequency, said input clock signal having one of binary values that has a voltage level which is similar to a reference voltage level of a reference voltage; and a voltage level converting circuit supplied with said PLL output clock signal, said control base clock signal, said reference voltage, and a voltage level control signal for converting, in response to said control base clock signal, said reference voltage, and said voltage level control signal, said PLL output clock signal to generate an output clock signal which has an output voltage level which is different from said reference voltage level;

wherein said voltage level converting circuit comprises:

an input voltage level detecting circuit supplied with said reference voltage for detecting said reference voltage to generate a converted reference signal;

a voltage level setting counter supplied with said control base clock signal and said voltage level control signal for generating, in response to said control base clock signal and said voltage level control signal, a counted voltage level setting signal;

an output terminal setting counter supplied with an output terminal setting signal for generating a counted output terminal setting signal;

first through n-th input output voltage level comparing circuits connected to said input voltage level detecting circuit, said voltage level setting counter, and said output terminal setting counter, where n represents an integer greater than two, one of said first through n-th input output voltage level comparing circuits being selected by said counted output terminal setting signal, said first through n-th input output voltage level comparing circuits being for comparing said converted reference signal with said counted voltage level setting signal to generate a voltage compared result signal; and first through n-th voltage decreasing units supplied with said control base clock signal and connected to said phase locked loop circuit, said input voltage level detecting circuit, and said first through n-th input output voltage level comparing circuits for decreasing said PLL output clock signal, in response to converted reference signal and said voltage compared result signal to generate one of first through n-th output clock signals as said output clock signal.

6. A clock signal generator as claimed in claim 5, wherein:

said converted reference signal comprises first through n-th converted reference signals, said voltage level setting signal comprising first through n-th voltage level setting signals, said voltage compared result signal comprising first through n-th voltage compared result signals, said counted output terminal setting signal comprising first through n-th counted output terminal setting signals;

said input voltage level detecting circuit having first through n-th voltage level output terminals which are connected to said first through n-th input output voltage level comparing circuits, said first through n-th converted reference signals being supplied to said first through n-th input output voltage level comparing circuits through said first through n-th voltage level output terminals;

said voltage level setting counter having first through n-th voltage level setting output terminals which are connected to said first through n-th input output voltage level comparing circuits, said first through n-th counted voltage level setting signals being supplied to said first through n-th input output voltage level comparing circuits through said first through n-th voltage level setting output terminals;

said output terminal setting counter hating first through n-th terminal setting output terminals which are connected to said first through n-th input output voltage level comparing circuits, said first through n-th counted output terminal setting signals being supplied to said first through n-th input output voltage level comparing circuits through said first through n-th terminal setting output terminals;

each of said first through n-th input output voltage level comparing circuits having first through n-th level compared result output terminals which are connected to said first through n-th voltage decreasing units, said first through n-th voltage compared result signals being supplied to said first through n-th voltage decreasing units through said first through n-th level compared result output terminals; and each of said first through n-th said voltage decreasing units comprising a decrease selecting circuit and first through n-th voltage decreasing circuits, said decrease selecting circuit being connected to said first through n-th voltage level output terminals and said first through n-th voltage decreasing circuits, said decrease selecting circuit being for generating, in response to said first through n-th converted reference signals, first through n-th decrease selection signals, each of said first through n-th voltage decreasing circuits comprising first through n-th voltage decreasing circuit portions which decrease said PLL output clock signal, in response to a respective one of said first through n-th decrease selection signals and said first through n-th voltage compared result signals to generate the one of said first through n-th output clock signals as said output clock signal.

* * * * *